(12) United States Patent
Wu

(10) Patent No.: US 7,957,159 B2
(45) Date of Patent: Jun. 7, 2011

(54) ELECTRONIC MODULE WITH SEAMLESS ANTI-EMI DEVICE

(75) Inventor: Jerry Wu, Irvine, CA (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 813 days.

(21) Appl. No.: 11/999,403

(22) Filed: Dec. 5, 2007

(65) Prior Publication Data

US 2009/0147493 A1 Jun. 11, 2009

(51) Int. Cl.
*H05K 9/00* (2006.01)

(52) U.S. Cl. .................... 361/818; 361/816; 361/799

(58) Field of Classification Search .................. 361/800, 361/816, 818, 796, 799, 801–803, 807, 810; 174/51, 35 R, 350, 354, 355, 374, 377; 439/607, 439/609, 939

See application file for complete search history.

(56) References Cited

U.S. PATENT DOCUMENTS

| | | | |
|---|---|---|---|
| 6,430,053 B1 * | 8/2002 | Peterson et al. | 361/728 |
| 6,478,622 B1 * | 11/2002 | Hwang | 439/607.2 |
| 6,758,699 B1 | 7/2004 | Hwang et al. | |
| 7,261,602 B2 * | 8/2007 | Lloyd | 439/701 |
| 7,566,246 B2 * | 7/2009 | Moore et al. | 439/607.01 |
| 7,802,929 B2 * | 9/2010 | Moore et al. | 385/92 |
| 2007/0117458 A1 * | 5/2007 | Winker et al. | 439/607 |

* cited by examiner

*Primary Examiner* — Hung S Bui
(74) *Attorney, Agent, or Firm* — Wei Te Chung; Andrew C. Cheng; Ming Chieh Chang

(57) ABSTRACT

An electronic module (10) includes a housing having outer surface, a metal gasket (5) attached to the housing and covering the outer surface. The gasket (5) has a set of first detents (53) and a set of second detents (52). The set of first detents (53) are spaced apart from each other and the set of second detents (52) substantially cover seams between the set of the first detents (53).

19 Claims, 6 Drawing Sheets

ELECTRONIC MODULE WITH SEAMLESS ANTI-EMI DEVICE

BACKGROUND OF THE INVENTION

1. Field of the Invention

The present invention generally relates to an electronic module, and more particularly to an electronic module having a metal gasket for suppressing Electro-Magnetic Interference (EMI).

2. Description of Related Art

A small form factor pluggable (SFP) module is widely used in signal transmission. This kind of module usually includes a plug connector connecting to an end of a cable and a receptacle connector mounted on the circuit substrate. The plug connector and the receptacle connector have metal shells or conductive shells to reduce EMI. However, as a gap exists between an interface of the plug connector and the receptacle connector, and the EMI phenomena can not be completely eliminated, so other method is proposed to settle this problem. U.S. Pat. Pub. No. 20070117458 A1 discloses an EMI-minimized transceiver, rectangular shaped collar (gasket) including a plurality of contact fingers (detents) for making electrical contact with a chassis in which a transceiver cage comprising the collar and the cage body is mounted.

The aforementioned EMI-minimized collar may help reducing EMI, however, as a slit is formed between two adjacent detents, some EMI leakage still passes through the slit.

Hence, an improved electronic module is highly desired to overcome the disadvantages of the related art.

SUMMARY OF THE INVENTION

Accordingly, an object of the present invention is to provide an electronic module using a metal gasket suppressing Electro-Magnetic Interference (EMI).

In order to achieve the object set forth, an electronic module comprising: a housing having outer surface; a metal gasket attached to the housing and covering the outer surface; and wherein the gasket includes a set of first detents and a set of second detents, the set of first detents spaced apart from each other and the set of second detents substantially covering seams between the set of the first detents.

Other objects, advantages and novel features of the invention will become more apparent from the following detailed description when taken in conjunction with the accompanying drawings.

DETAILED DESCRIPTION OF THE INVENTION

Figure 1:
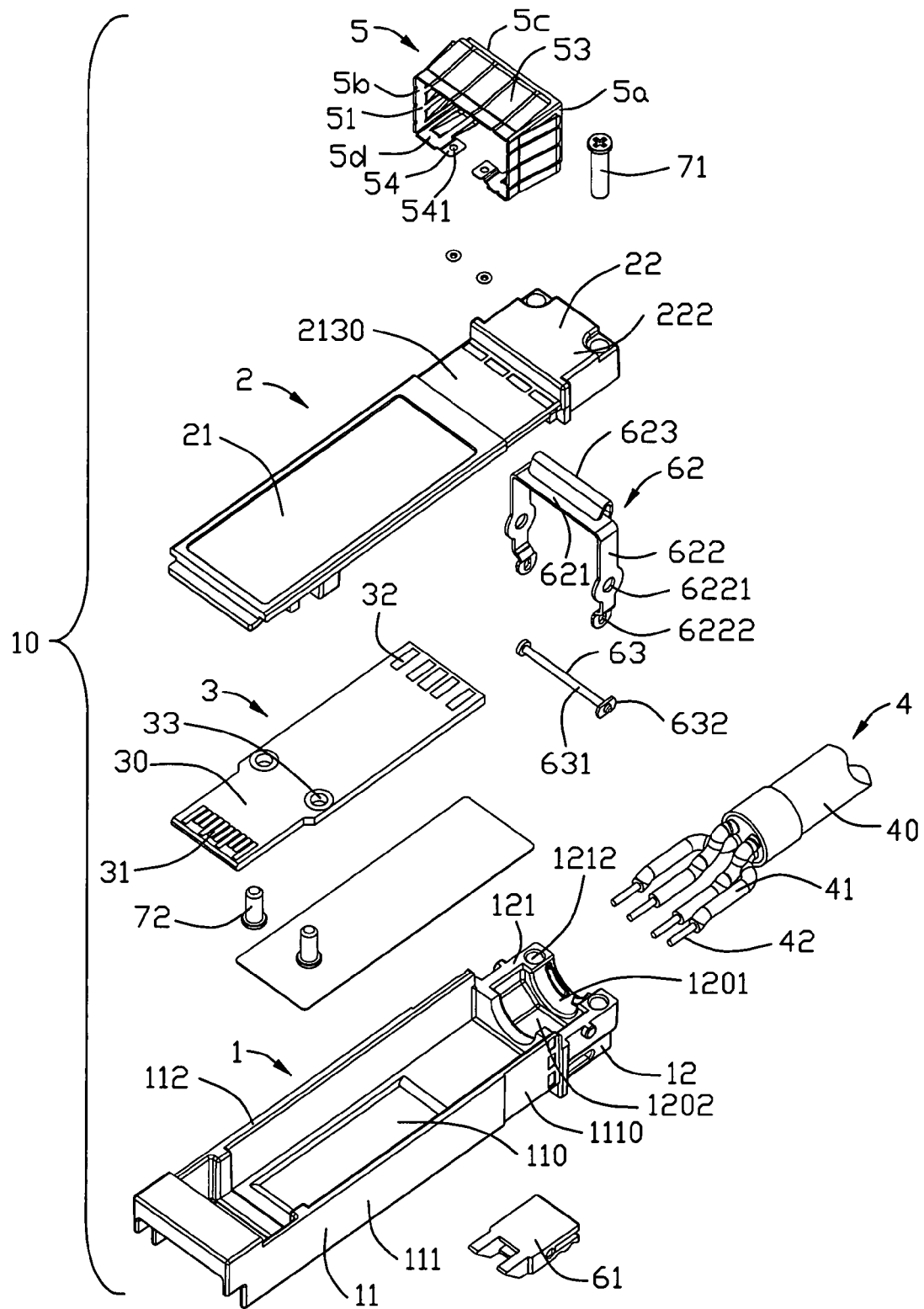
FIG. 1 is an exploded, perspective view of an electronic module in accordance with the present invention.

Reference will now be made in detail to the preferred embodiment of the present invention.

Referring to FIGS. 1-6, the electronic module 10 comprises a housing (not numbered) composed of a conductive base portion 1 and a conductive panel portion 2, a printed circuit board 3, a cable 4, a metal gasket 5 and an actuator mechanism (not numbered).

Figure 2:
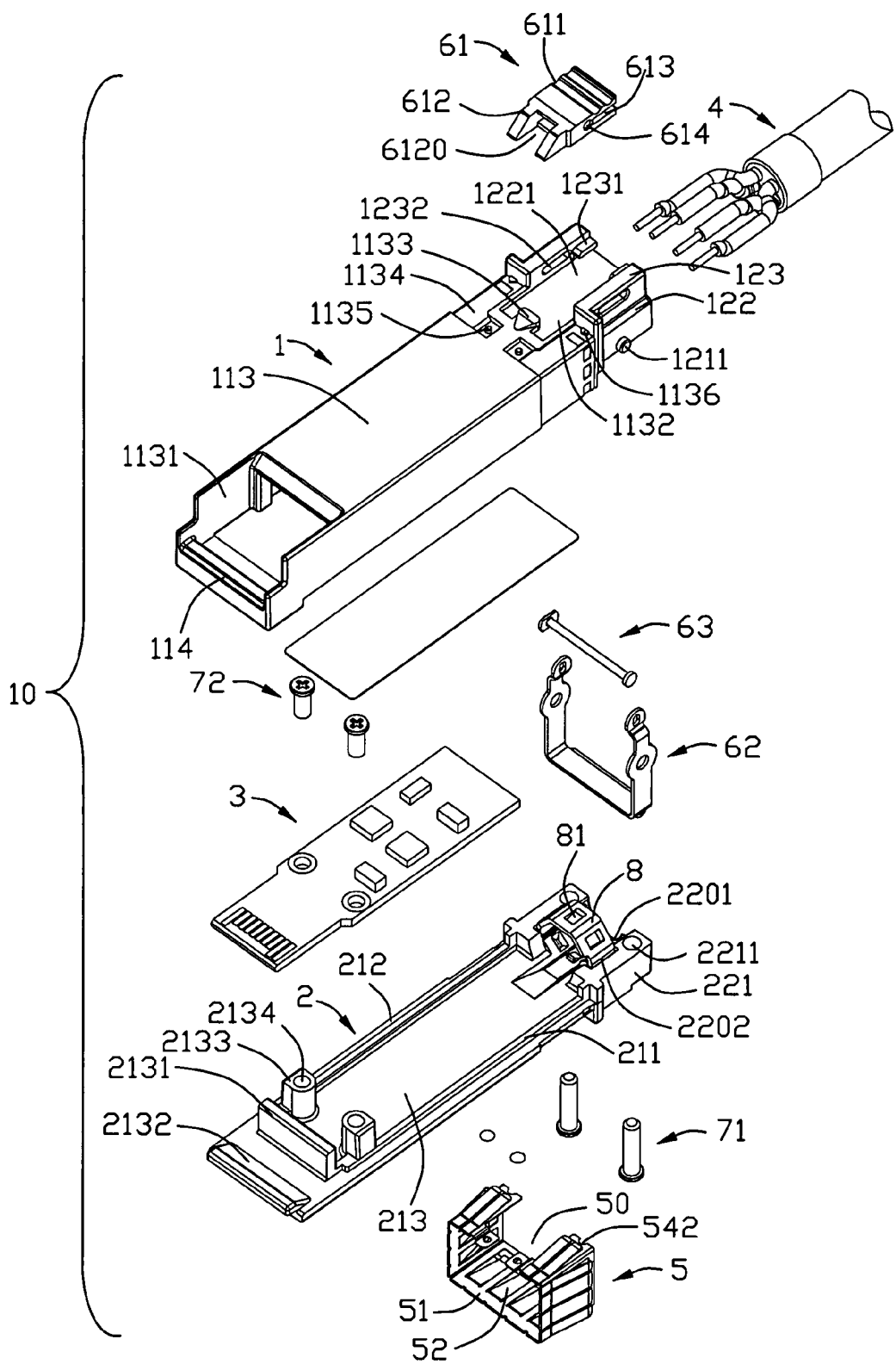
FIG. 2 is a view similar to FIG. 1, but viewed from another aspect.

Referring to FIGS. 1-2, the base portion 1 is die-cast or other metal plated body, including a primary body portion 11 and a first mounting portion 12 rearward extending from back face of the primary body portion 11. The primary body portion 11 has a pair of lateral walls 111, 112 and a bottom wall 113 joining to lower sections of the lateral walls 111, 112 to from a receiving space 110 with an upper window (not numbered). Rear sections of the pair of the lateral walls 11, 12 define a pair of first depression portions 1110. A front section of the bottom wall 113 is cut to form an outlet 1131. A rear section of the bottom wall defines a first channel 1132 located in a middle area thereof, with a tab 1133 formed in the front of the first channel 1132. A pair of L-shaped depression portions 1134 are defined in two lateral areas of the rear section of the bottom wall 113, arranged at outward of the first channel 1132. A pair of tiny posts 1135 respectively formed in forward corners (not numbered) of the pair of depression portions 1134, and a pair of protrusion members 1136 respectively formed in a rear corners (not numbered) thereof. The primary body portion 11 further has beam portion 114 with substantially L-shaped cross-section interconnecting distal portions of the pair of the lateral walls 111.

The first mounting portion 12 has a pair of side walls 121 and a lower wall 122 to corporately form a first semi-circular cavity 1201 and a deeper first position slot 1202 located in front of the first semi-circular cavity 1201. A second channel 1221 is defined in a middle area of the lower wall 122 and communicates with the first channel 1132 of the primary body portion 11. A pair of guiding members 123 are respectively formed on lateral areas of the lower wall 122. Each guiding member 123 has a thin bar member 1231 formed on a back section of the inward surface thereof and a lengthways guiding passage 1232 in front of the bar member 1231. A pair of pivot members 1211 are respectively formed on upper sections of the outward surfaces of the pair of side walls 121. A pair of screw holes 1212 are respectively recessed downward from up surfaces of rear sections of side walls 121.

The panel portion 2 is die-cast or metal plated body, including a secondary body portion 21 and a second mounting portion 22 rearward extending from back face of the secondary body portion 21. The secondary body portion 21 has a planar board member 213 and a pair of flange members 211, 212 formed on a bottom surface thereof laterally. An upper section of the board member 213 defines a second depression portion 2130. A front section of the board member 213 forms a vertical wall 2131. A pair of supporting posts 2133 are located back of the vertical wall 2131, and each supporting post further defines a second screw hole 2134 therein. A protrusion portion 2132 is formed at forward end of the board member 213.

The panel portion 2 further includes a second mounting portion 22 rearward extending from a back face of the secondary body portion 21. The second mounting portion 22 also has a pair of side walls 221 and a lower wall 222 to corporately form a second semi-circular cavity 2201 and a deeper second position slot 2202 located in front of the second semi-circular cavity 2201. A pair of through holes 2211 are respectively defined in a rear section of the side walls 221.

The actuator mechanism includes a slider member 61, an actuator member 62 and a fasten member 63. The slider member 61 has a substantially rectangular shaped body portion 611 and two wedge-shaped arm portions 612 extending forward from front face of the body portion 611. The two arm portions 612 space from one another, with an opening 6120 formed therebetween. The body portion 611 has two grooves 613 respectively recessed inward from lateral surfaces of a rear segment thereof and a transverse through hole 614 in a middle section thereof, adjacent to the grooves 613. The actuator member 62 is configured to doorframe-shaped, including a doorhead 621 and two doorjambs 622. A curved handle member 623 is formed at rear edge of the doorhead 621 and protruding upwardly. A pair of first positioning holes 6221 are defined in a middle section of the doorjambs 622, and a pair of mounting holes 6222 is defined through the lower ends thereof. The fasten member 63 is of rod-shaped, including a bolt member 631 and a nut 632.

Referring to FIGS. 1-2 and 5-6, the gasket 5 is made of sheet metal and configured to rectangular-shaped frame portion 51, including a pair of vertical sides 5a, 5b, an upper side 5c joining upper edges of the pair of vertical sides 5a, 5b, a pair of lower sub-walls 5d respectively extending inwardly from lower edges of the pair of vertical walls 5a, 5b. A lower outlet 50 formed between the pair of lower sub-walls 5d for assembling easily. A number of detents 52, 53 separated into a layer of first (outward) detents 53 and a layer of second (inward) detents 52 are formed on the frame portion 51. The layer of first detents 53 extend forward and outward from rear edge of the frame portion 52, while the layer of second detents 52 are stamped of the frame portion 51 and outward deflect the frame portion 51. The first detents 53 are spaced from each other, and each pair of adjacent detents has a seam (gap) therebetween. The layer of second detents 52 substantially cover seams of the first detents 53 (see FIG. 6). In other words, the layer of second detents 52 are adjacent to and align with seams of the layer of the first detents 52 (see FIG. 6), to configure a seamless anti-EMI device to achieve better EMI suppressing effect. A pair of mounting members 54 are formed on free ends of the pair of lower sub-walls 5d, extend into the lower outlet 50. Each sub-wall 5d has a semi-circular cutout 542 located in a distal end thereof to accommodate corresponding protrusion members 1136 in the L-shaped depression portion 1134.

The printed circuit board 3 includes a substrate 30, a plurality of first conductive pads 31 arranged on a front section of the substrate 30 and a plurality of second conductive pads 32 located on rear section thereof. A pair of positioning holes 33 are defined in the substrate 30, proximate a front section thereof.

The cable 4 includes an outer insulative jacket 40, a number of wires 41 enclosed in the jacket 40 and insulated from each other. Each of the wires 41 further has an inner conductor 42 for transmitting signal.

Figure 3:
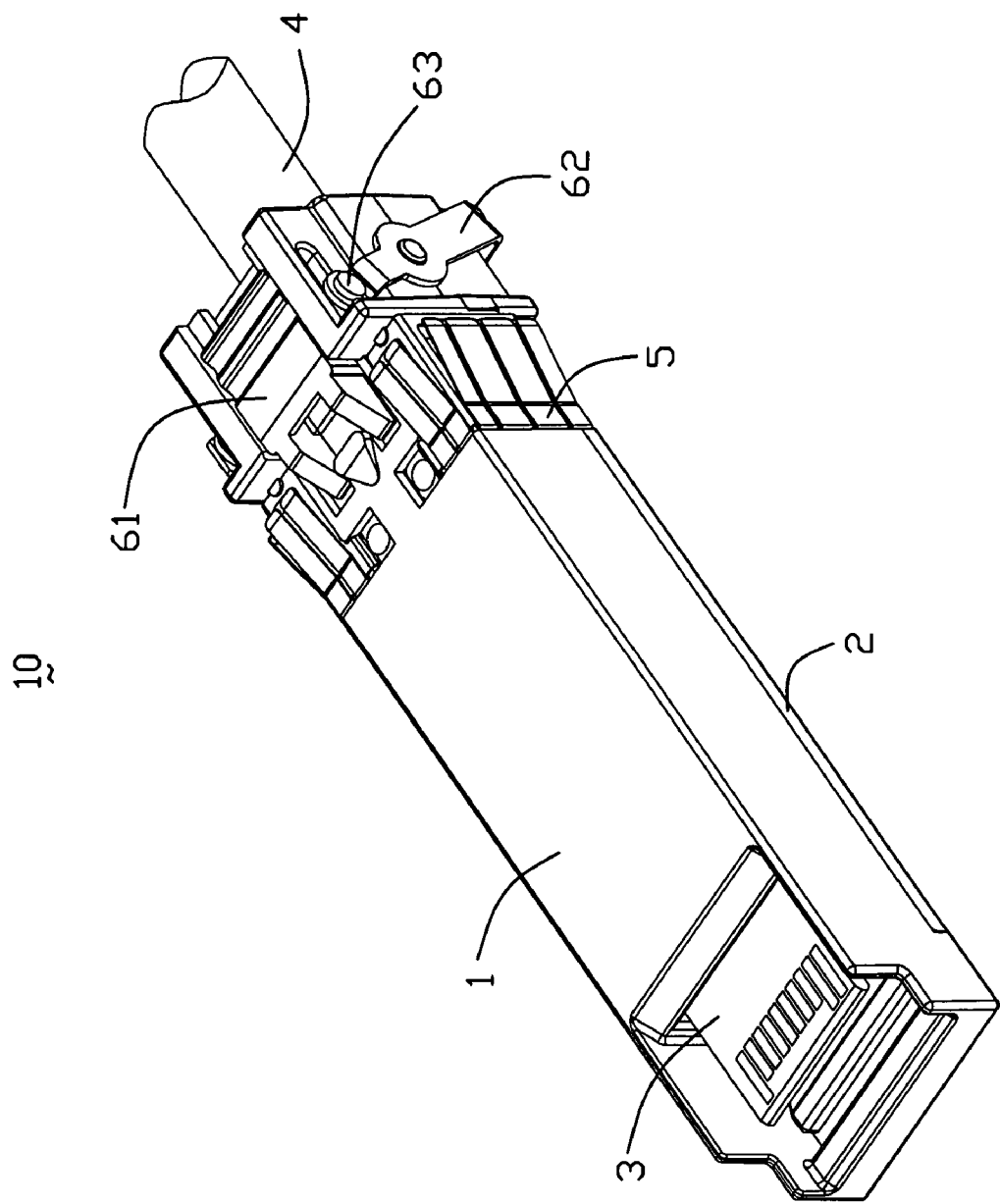
FIG. 3 is an assembled, perspective view of the electronic module shown in FIG. 2.
Figure 4:
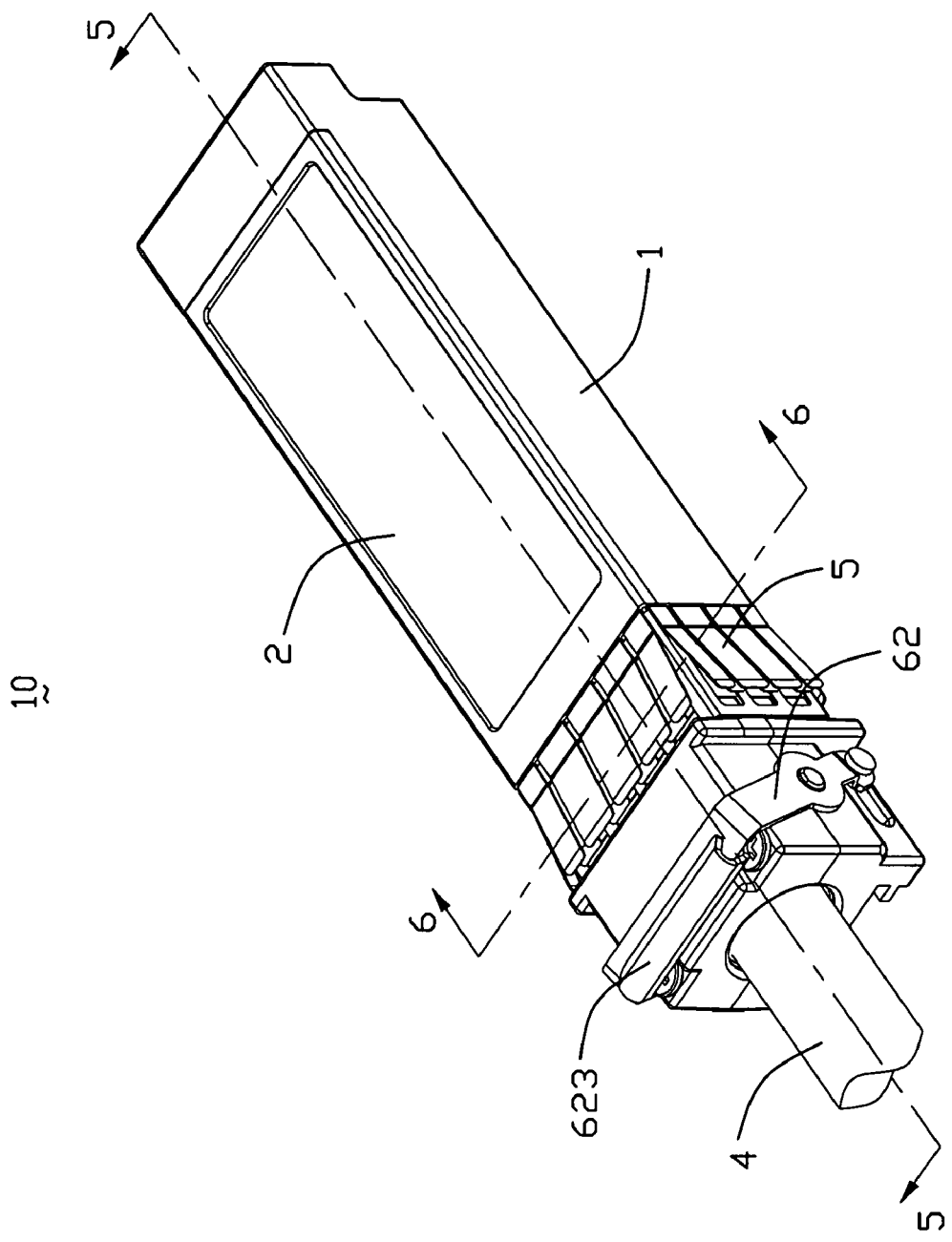
FIG. 4 is a view similar to FIG. 3, but viewed from another aspect.
Figure 5:
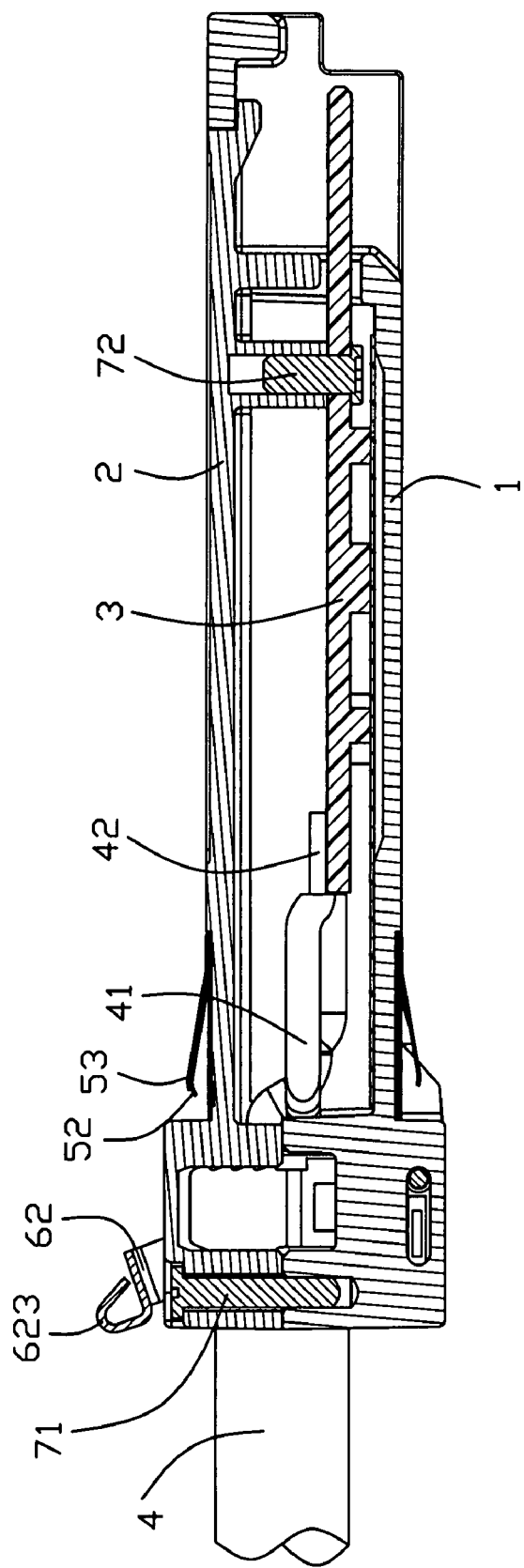
FIG. 5 is a cross-section view taken along line 5-5 of FIG. 4.
Figure 6:
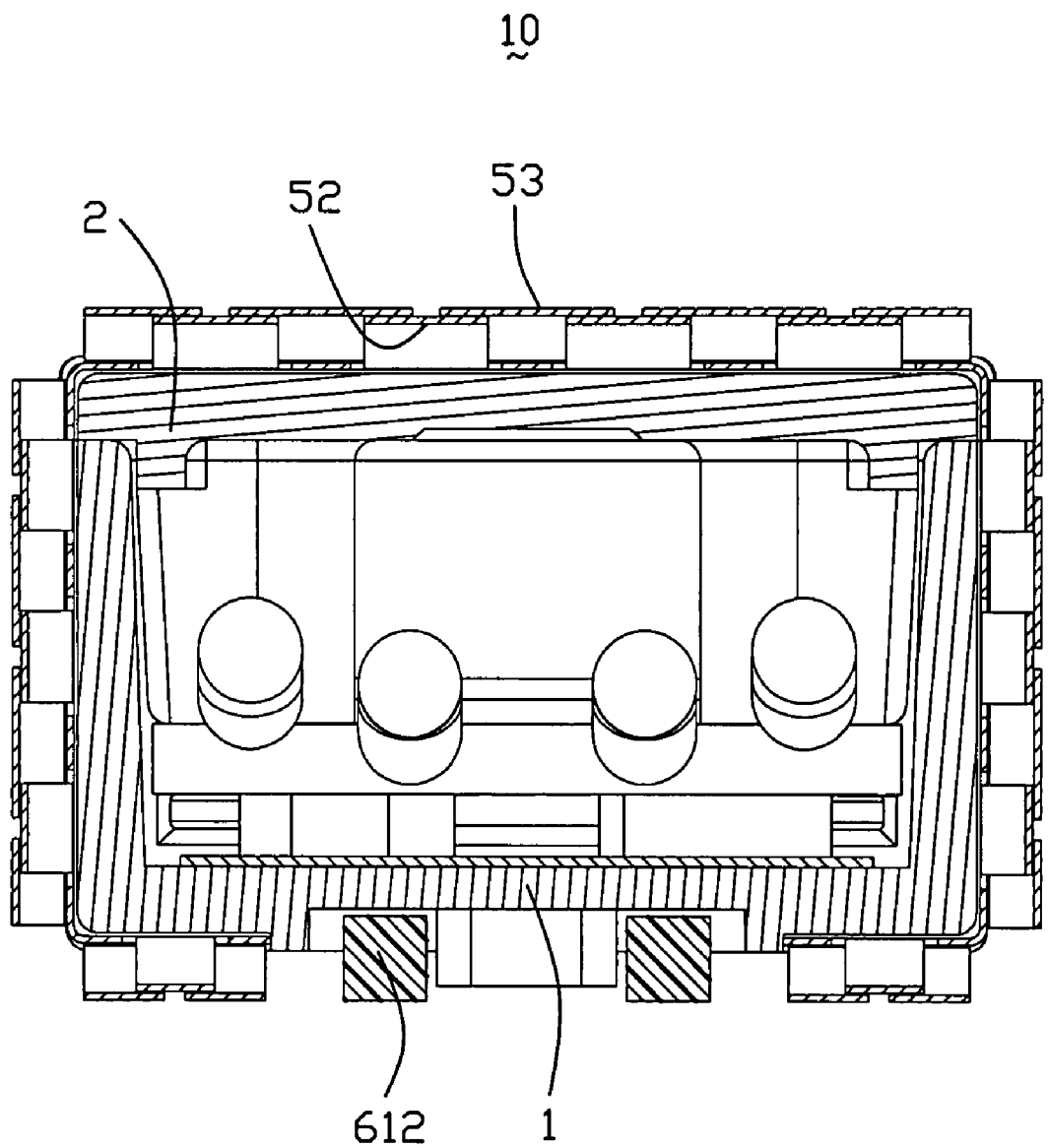
FIG. 6 is a cross-section view taken along line 6-6 of FIG. 4.

Referring to FIGS. 3-4, in conjunction with FIGS. 1-2 and 5-6, When assembly, the insulative jacket 40 of a front segment of the cable 4 is decorticated and then the wires 41 are exposed outside, and then front section of the inner conductors 42 are made to expose outward; then a cable holder member 8 is crimped to a front part of the cable 4, adjacent to exposed wires 41, with teeth 81 thereof biting into the insulative jacket 40. The inner conductors 42 are soldered to the second conductive pads 32 of the PCB 3. The PCB 3 is put on the pair of supporting posts 2133 of the panel portion 2, with the pair of positioning holes 33 thereof aligning with the pair of second screw holes 2134 of the pair of supporting posts 2133, and then a pair of second screw members 72 are inserted into the pair of positioning holes 33 and the pair of second screw holes 2134 to fix the PCB 3 to the panel portion 2. Partial of the cable holder member 8 is pressed into the second position slot 2202 of the panel portion 2. The panel portion 2 is assembled to the base portion 1, with a pair of lateral flange members 211, 212 thereof inserted into the receiving space 110, the protrusion portion 2132 supported by the beam portion 114 of the base portion 1, Simultaneously, the PCB 3 is received in the receiving space 110, a remaining portion of the cable holder 8 is received in the first position slot 1202, the pair of through holes 2211 of the panel portion 2 aligning with a pair of screw holes 1212 of the base portion 1, then a pair of first screw members 71 are inserted into the through holes 2211 and screw holes 1212 to fasten the panel portion 2 and the base portion 1 together.

The gasket 5 is assembled to an outer surface of the housing, with a pair of vertical sides 5a, 5b thereof located in the a pair of first depression portions 1110 of the base portion 1, an upper side 5c thereof located in the second depression portions 2130 of the panel portion 2, a pair of lower sub-walls 5d located in the pair of L-shaped depression portions 1134, the pair of tiny posts 1135 inserted into a pair of through holes 541 of the pair of mounting members 54 and then soldered thereto. The slider member 61 is assembled to the second channel 1221 of the first mounting portion 12, with the pair of thin bar members 1231 of the two guiding members 123 received in the two grooves 613 thereof, the through hole 614 thereof aligning with guiding passages 1232 of the two guiding members 123, the opening 6120 between the arm portions 612 facing to the tab 1133 in the first channel 1132. Then, the actuator member 62 is assembled to the first mounting portion 12 of the base portion 12, with the pair of pivot members 1211 of the first mounting portion received in the pair of first positioning holes 6221 of the doorjambs 622 of the actuator member 62, the pair of mounting holes 6222 located in the end section of the doorjambs 622 aligning with the through hole 614 of the slider member 61 and the through holes 1232 of the two guiding members 123, then the a bolt member 631 is inserted through the pair of mounting holes 6222, the through holes 614, guiding passages 1232, and the nut 632 is finally assembled to end of the bolt member 631.

When the electronic module 10 mates with the complementary connector (not shown), the layer of first detents 53 contact with a cage (not shown) of the complementary connector to reduce EMI nearby an interface between a front segment of the complementary connector and rear portions of the primary body portion 11 of the base portion 1 and secondary body portion 21 of the panel portion 2, and the layer of second detents 52 may further prevent EMI leakage through slits between adjacent detents of the layer of first detents 53.

While the electronic module 10 disengages away the complementary connector, just exert a pulling force on the handle member 623 of the actuator member 62 to promote the slider member 61 moving forwardly to reversely push the electronic module 10 moving backward to depart the complementary connector.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. An electronic module with seamless anti-EMI device, comprising:
   a housing having outer surface;
   a metal gasket attached to the housing and substantially covering the outer surface; and wherein the gasket includes a set of first detents and a set of second detents, the set of first detents spaced apart from each other and the set of second detents substantially covering seams between the set of the first detents;

wherein the housing includes a conductive base portion having a primary body portion defining a receiving space, a conductive panel portion having a secondary body portion covering an upper window of the receiving space;

wherein the base portion further includes first mounting portion rearward extending from back face of the primary body portion, wherein the panel portion further includes second mounting portion rearward extending from back face of the secondary body portion;

wherein the first mounting portion defines a first semi-circular cavity, wherein the second mounting portion defines a second semi-circular cavity, and wherein a cable is inserted into the receiving space via the first and second cavities.

2. The electronic module as claimed in claim 1, wherein the metal gasket has a frame portion, with the first detents extending forward and outward from rear edge of the frame portion, the second detents being stamped of the frame portion and outward deflect the frame portion.

3. The electronic module as claimed in claim 1, wherein the primary body portion of the base portion includes a pair of lateral walls and a bottom wall joining to the pair of the lateral wall to from the receiving space, wherein the primary body portion has beam portion with substantially L-shaped cross-section interconnecting free end portions of the pair of the lateral walls, and wherein the secondary body portion of the panel portion has a protrusion portion formed at forward end thereof disposed on the beam portion.

4. The electronic module as claimed in claim 3, wherein rear segments of the pair of the lateral walls of the primary body portion define first depression portions, wherein a rear segment of the secondary body portion of the secondary body portion defines second depression portion, and wherein the gasket is positioned in the first and second depression portions.

5. The electronic module as claimed in claim 1, wherein a printed circuit board is located in the receiving space and fixed to the conductive panel portion.

6. The electronic module as claimed in claim 1, wherein the first mounting portion defines a deeper first position slot in a front portion of the first semi-circular cavity, wherein the second mounting portion defines a deeper second position slot in a front portion of the second semi-circular cavity.

7. The electronic module as claimed in claim 6, wherein a cable holder member crimped onto a front section of the cable and retained in the first and second positioning slots.

8. The electronic module as claimed in claim 1, further comprising an actuate mechanism.

9. The electronic module as claimed in claim 8, wherein the actuator mechanism includes a slider member located in a channel of rear section of the base portion, an actuator member pivotally engaged with the base portion and a fasten member linkaged the slider member and the actuator member.

10. The electronic module as claimed in claim 9, further comprises a pair of guiding members respectively formed on rear section of the base portion, laterally arranged the channel of the base portion.

11. The electronic module as claimed in claim 10, wherein each of guiding member has a bar member formed on a back section of the inward surface thereof and a lengthways guiding passage in front of the bar member.

12. The electronic module as claimed in claim 11, wherein the slider member includes a body portion having two grooves respectively recessed inward from lateral surfaces of a rear segment thereof and a transverse through hole in a middle section thereof, in front of the grooves.

13. The electronic module as claimed in claim 12, wherein the actuator member is configured to doorframe-shaped, including a doorhead with handle member formed thereon and two doorjambs having a pair of mounting holes defined through the lower ends thereof.

14. The electronic module as claimed in claim 13, wherein the bar members of the pair of guiding member received in the two grooves of the base portion of the slider member respectively, wherein the mounting holds of the actuator aligning with the guiding passages of the pair of the guiding members and the transverse through hole of the slider member to allow the fasten member pass through.

15. A metal gasket for suppressing Electro Magnetic Interference, comprising:
a frame portion having a pair of vertical sides and an upper side joining upper edges of the pair of vertical sides;
a number of detents formed on the upper and the pair of vertical sides of the frame portion; and
wherein the detents are separated into a layer of first detents spaced apart each and a layer of second detents enclosed by the layer of first detents, with at least one of the second detents adjacent to and aligning with a seam between a pair of the first detents.

16. An electronic module with seamless anti-EMI device comprising:
a housing having an outer surface;
a metal gasket attached to the housing and substantially covering the outer surface, the gasket includes a set of outer detents and a set of inner detents both of which extend outwardly away from the outer surface, wherein the outer detent extends from an outer edge of the metal gasket and is closely overlapped with the corresponding inner detent in a vertical direction so that when the metal gasket is compressed inwardly, the outer detent presses the corresponding inner detent inwardly.

17. The electronic module as claimed in claim 16, wherein said inner detent extends from an inner edge of an opening in the gasket.

18. The electronic module as claimed in claim 16, wherein the outer detent is arranged adjacent to corresponding inner detent in a staggered manner.

19. The electronic module as claimed in claim 16, wherein the outer detent and corresponding inner detent extend along a same direction and intimately contact with each other along a distance.

* * * * *